United States Patent [19]

Yumoto

[11] Patent Number: 5,132,574
[45] Date of Patent: Jul. 21, 1992

[54] MOS OUTPUT CIRCUIT
[75] Inventor: Akira Yumoto, Kanagawa, Japan
[73] Assignee: Sony Corporation, Tokyo, Japan
[21] Appl. No.: 644,627
[22] Filed: Jan. 23, 1991
[30] Foreign Application Priority Data Jan. 24, 1990 [JP] Japan .................. 2-14061

[51] Int. Cl.[5] .............................. G11C 7/00
[52] U.S. Cl. ...................... 307/530; 365/190
[58] Field of Search ........... 307/448, 451, 497, 530; 365/189.05, 189.08, 190

[56] References Cited

U.S. PATENT DOCUMENTS 4,144,590  3/1979  Kitagawa ................. 307/530 X
4,397,000  8/1983  Nagani ................... 307/530 X
4,604,731  8/1986  Konishi .................. 307/530 X

FOREIGN PATENT DOCUMENTS 1149290  6/1989  Japan .

OTHER PUBLICATIONS

IEEE Journal of Solid-State Circuits, vol. 23, No. 5, Oct. 1988; "A 7.5-ns 32 K×8 CMOS SRAM", by Hiroaki Okuyama et al., pp. 1054-1059.

Primary Examiner—Steven Mottola
Attorney, Agent, or Firm—Hill, Van Santen, Steadman & Simpson

[57] ABSTRACT

An output circuit for a memory device has four MOS transistors. A first MOS transistor and a second MOS transistor comprise an output stage of the output circuit, and a control circuit controls the voltages of the gates of the first and the second MOS transistors. A third MOS transistor has its source connected to the gate of the second MOS transistor, and a fourth MOS transistor has its source connected to the gate of the first MOS transistor. When the data which are supplied to the control circuit are changed, the third or the fourth MOS transistor assists the level shift of the gate of the second and the first MOS transistor at the beginning of the level shift. By continuing the level shift, the third or the fourth MOS transistor is turned off. As a result, the source-gate voltage of the third or the fourth MOS transistor becomes lower than its threshold voltage, so that the switching noise or ground noise is reduced.

14 Claims, 3 Drawing Sheets

MOS OUTPUT CIRCUIT

FIELD OF THE INVENTION

This invention relates to an output circuit for a memory formed by MOS transistors.

DESCRIPTION OF THE PRIOR ART

In general, a demand for a higher speed is raised for an output circuit adapted for outputting data of a memory device formed by MOS transistors.

However, with an increase in the operating speed of the memory device formed by MOS transistors, problems are raised in connection with the noise produced during switching of the output circuit. This switching noise is caused by the high in-rush current flowing at the instant at which the output stage MOS transistor is turned on, and the parasitic capacitance which inevitably exists on the source voltage line or the ground potential line. Such noise or fluctuations in the voltage level in the source voltage line or the ground potential line affect seriously the memory device itself or peripheral devices. In order to reduce the noise, it is effective to swing the levels of the gates of the output stage MOS transistor gradually, but high-speed access is not achieved.

OBJECTS AND SUMMARY OF THE INVENTION

Figure 1:
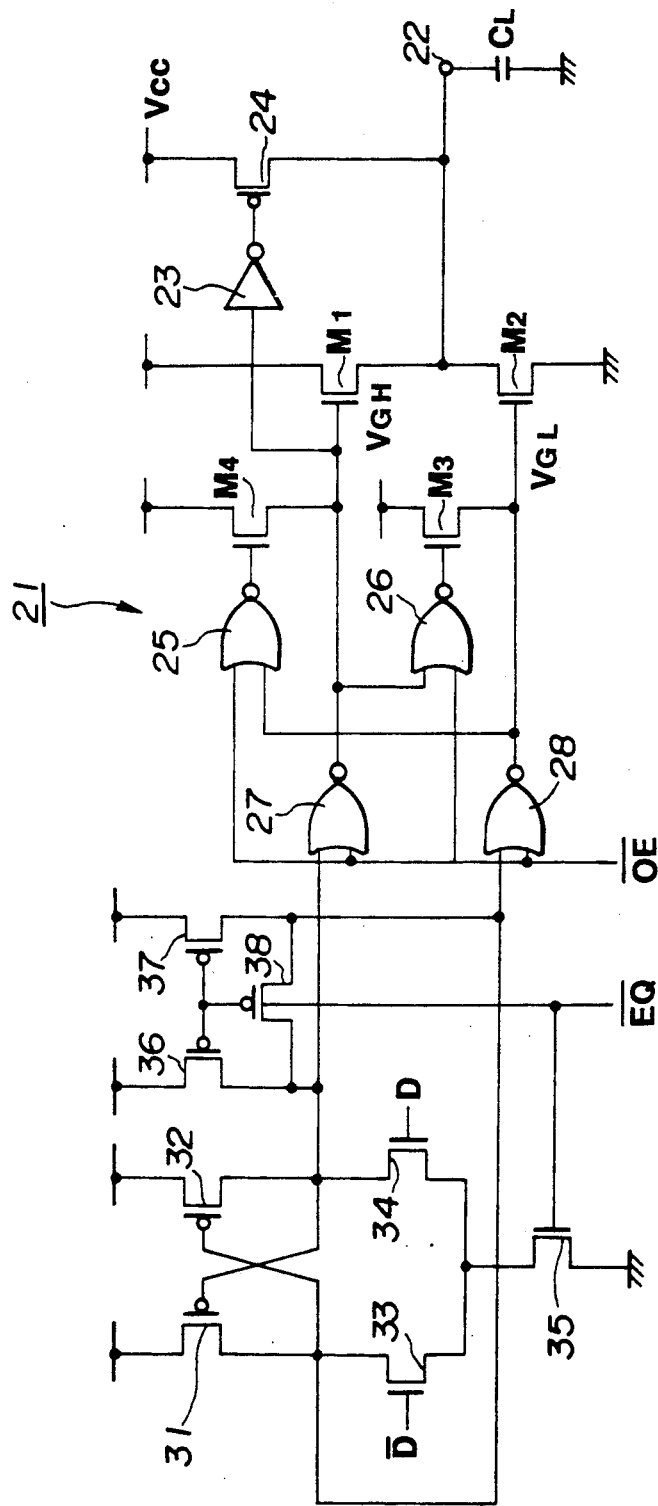
FIG. 1 is a circuit diagram showing an output circuit according to an embodiment of the present invention.

It is therefore an object of the present invention to provide an output circuit whereby outputting at a higher speed becomes possible and switching noises may be reduced.

For accomplishing the above object, the output circuit of the present invention comprises an output stage having a first MOS transistor having its drain and source connected to the power source line and to the output terminal and a second MOS transistor having its drain and source connected to the output terminal and the ground potential line. According to the present invention, the output circuit further comprises a control circuit connected to the gates of the output stage MOS transistors and responsive to output data to control the gate voltages, a third MOS transistor controlled in response to the gate voltage of said first MOS transistor and having its source connected to the gate of the second MOS transistor and its drain supplied with a predetermined voltage, and a fourth MOS transistor controlled in response to the gate voltage of said second MOS transistor and having its source connected to the gate of said first MOS transistor and its drain supplied with a predetermined voltage.

The channels of the first and the third MOS transistors may be of the same conductivity type, and the channels of the second and the fourth MOS transistors may also be of the same conductivity type.

DESCRIPTION OF THE PREFERRED EMBODIMENT

By referring to the drawings, a preferred embodiment of the present invention will be explained in detail.

The present embodiment is an example of an output circuit for a MOS memory formed by, for example, an SRAM or a DRAM, in which the gates of MOS transistors forming an output stage are charged electrically.

FIG. 1 shows a circuit arrangement of the output circuit 21. The output stage of the output circuit 21 is formed by an nMOS transistor $M_1$ as a first MOS transistor and an nMOS transistor $M_2$ as a second MOS transistor.

The nMOS transistor $M_1$ has its drain and source connected to a source voltage line and to an output terminal 22, respectively. The nMOS transistor $M_1$ has its gate connected to an output terminal of a NOR circuit 27 so as to be controlled by the NOR circuit 27. An nMOS transistor $M_4$, a fourth MOS transistor, has its source connected to the gate of the nMOS transistor $M_1$, to which the input terminal of an invertor 23 is also connected. An nMOS transistor $M_2$ has its drain and source connected to the output terminal 22 and to the ground potential line, respectively. The nMOS transistor $M_2$ has its gate connected to an output terminal of a NOR circuit 28 so as to be controlled by the NOR circuit 28. An nMOS transistor $M_3$, a third MOS transistor, has its source connected to the gate of the nMOS transistor $M_2$, to which one input terminal of a NOR circuit 25 is also connected.

A pMOS transistor 24 is controlled by the invertor 23, the input terminal of which is connected to the gate of the nMOS transistor $M_1$. The function of this pMOS transistor 24 is to raise the voltage level at the output terminal 22. The voltage source Vcc is supplied to the source of the pMOS transistor 24. Hence, when the gate voltage $V_{GH}$ of the nMOS transistor $M_1$ is at the high level or "H" level, the output level of the invertor 3 is at the low level or "L" level to turn on the pMOS transistor 24 to raise the voltage at the output terminal 22.

The abovementioned NOR circuits 27 and 28 constitute a control circuit which is responsive to signals from a sense amplifier for driving the nMOS transistors $M_1$ and $M_2$ of the output stage, respectively. The NOR circuit 27 has two input terminals, one of which is connected to the drain of an nMOS transistor 34 constituting the sense amplifier and the other of which is supplied with an output enable signal OE. The output terminal of the NOR circuit 27 is connected to the gate of the nMOS transistor $M_1$. Similarly to the NOR circuit 27, the NOR circuit 28 has two input terminals, one of which is connected to the drain of an nMOS transistor 33 forming the sense amplifier and the other of which is supplied with the output enable signal OE. The output terminal of the NOR circuit 28 is connected to the gate of the nMOS transistor $M_2$.

The NOR circuits 25, 26 function to drive nMOS transistors $M_3$ and $M_4$ adapted for electrically charging the gates of the output stage nMOS transistors $M_2$ and $M_1$. The NOR circuit 25 has two input terminals, one of which is connected to the gate of the nMOS transistor $M_2$ and the other of which is supplied with the output enable signal OE. The output terminal of the NOR circuit 25 is connected to the gate of the nMOS transistor $M_4$ for driving the nMOS transistor $M_4$. Similarly to the NOR circuit 25, the NOR circuit 26 has two input terminals, one of which is connected to the gate of the nMOS transistor $M_1$ and the other of which is supplied with the output enable signal OE. The output terminal of the NOR circuit 26 is connected to the gate of the nMOS transistor $M_3$ for driving the nMOS transistor $M_3$.

The nMOS transistors $M_3$ and $M_4$ form a circuit for electrically charging the output stage nMOS transistors $M_2$ and $M_1$. When the output data are inverted, these nMOS transistors $M_3$ and $M_4$ are turned on to permit high speed electrical charging of the gates. The nMOS transistor $M_3$ has its gate and source connected to the output terminal of the NOR circuit 26 and to the gate of the nMOS transistor $M_2$, respectively. The source voltage Vcc is supplied to the drain of the nMOS transistor $M_3$. The nMOS transistor $M_4$ has its gate and source conected to the output of the NOR circuit 25 and to the gate of the nMOS transistor $M_1$, respectively. The source voltage Vcc is similarly supplied to the drain of the nMOS transistor $M_4$. Since the nMOS transistors $M_3$ and $M_4$ have their sources connected to the gates of the output stage nMOS transistors $M_2$ and $M_1$ which are subject to changes in the potential level, the nMOS transistors $M_3$ and $M_4$ are turned off when the source to gate voltage is below the threshold voltage Vth. The result is that the noise is reduced during the turn-off period.

The data transferred to the output circuit 21 are supplied from the sense amplifier which is made up of a pair of pMOS transistors 31 and 32, the above mentioned nMOS transistors 33 and 34, a constant current source, and an nMOS transistor 35 functioning as a switch. This sense amplifier amplifies a signal from a memory cell. The source voltage Vcc is supplied to the sources of the pMOS transistors 31 and 32. The drains and the gates of the pMOS transistors 31 and 32 are cross-coupled to each other. The nMOS transistor 34 has its drain connected to the drain of the pMOS transistor 32 and has its gate supplied with a signal D from the memory cell. The nMOS transistor 33 has its drain connected to the drain of the pMOS transistor 31, while having its gate supplied with a signal D̄ from the memory cell. The signal D̄ has a level which is an inversion of the signal D. The ground voltage GND is applied to the source of the nMOS transistor 35, while an equalizing signal EQ is supplied to the gate of the transistor 35. Hence, when the equalizing signal EQ is at the "H" level, the sense amplifier is in operation and, when the signal EQ is at the "L" level, the sense amplifier is not in operation.

pMOS transistors 36, 37 and 38 are pull-up and equalizing MOS transistors controlled by the equalizing signal EQ. The source voltage Vcc is supplied to the source of the pMOS transistors 36 and 37. The drain of the pMOS transistor 36 is connected to the drain of the pMOS transistor 32 and the drain of the pMOS transistor 37 is connected to the drain of the pMOS transistor 31. The equalizing signal EQ is supplied to the gates of the pMOS transistors 36 and 37, such that, with the equalizing signal EQ at the "L" level, the drain potential of each of the pMOS transistors 36 and 37 is pulled up. The pMOS transistor 38 is an equalizing transistor.

The source and the drain of the pMOS transistor 38 are connected to the drains of the pMOS transistors 31 and 32, respectively. With the equalizing signal EQ at the "L" level, these drains are shorted for equalization.

Figure 2:
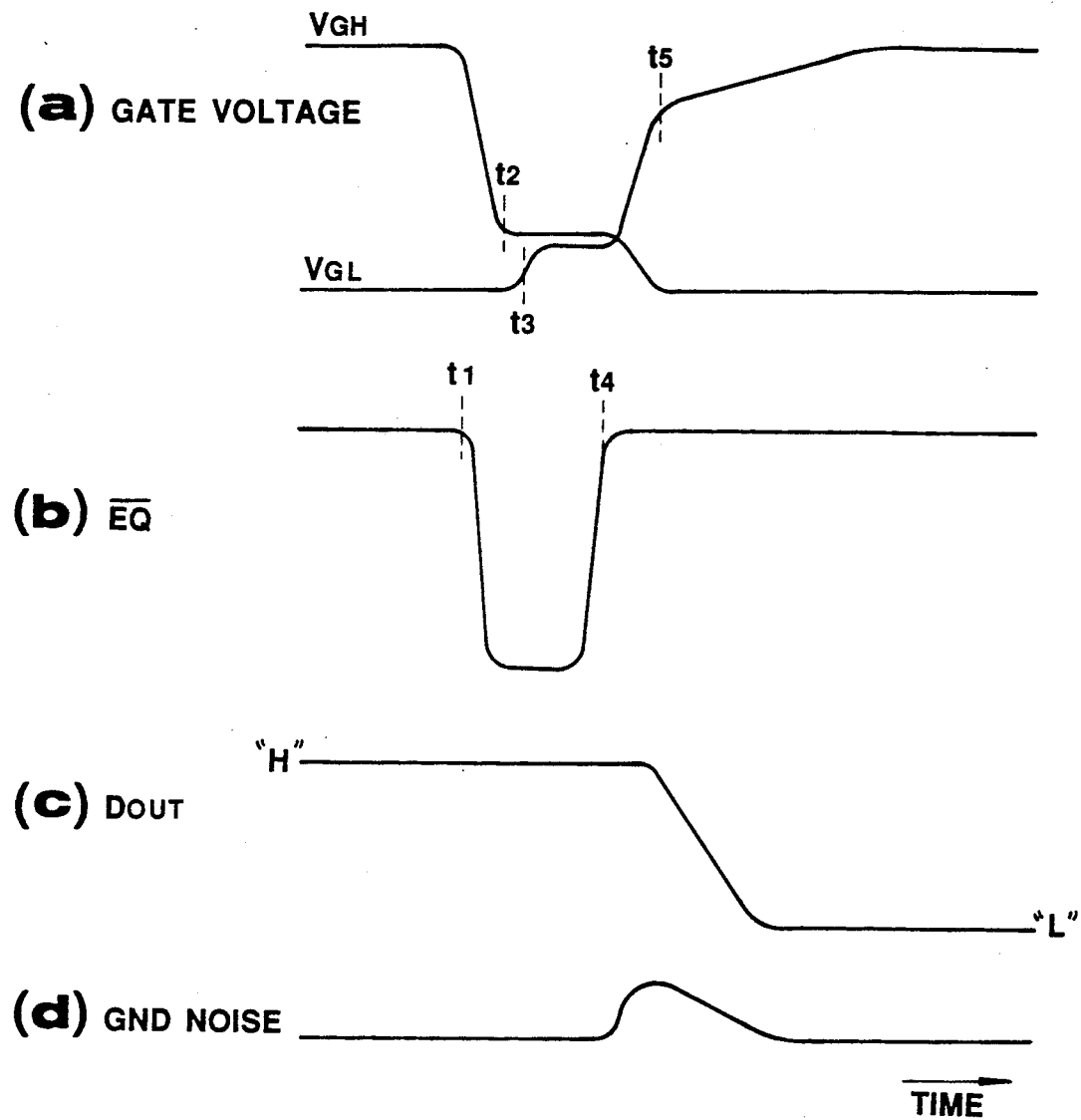
FIG. 2 is a waveform diagram for illustrating the operation of the output circuit shown in FIG. 1.

Referring to FIG. 2, the operation of the output circuit 21 is explained.

If the signal D is initially at the "H" level, the "L" level signal is supplied from the sense amplifier to the NOR circuit 27, while the "H" level signal is supplied form the sense amplifier to the NOR circuit 28, by the sense amplifier operation. It is assumed that the output of the NOR gate 27, that is the gate voltage $V_{GH}$ of the nMOS transistor $M_1$, is at the "H" level, and the output of the NOR gate 28, that is the gate voltage $V_{GL}$ of the nMOS transistor $M_2$, is at the "L" level, as shown at (a) in FIG. 2. At this time, the equalizing signal EQ is at the "H" level, as shown at (b) in FIG. 2, while the output enable signal OE is at the "L" level.

At time $t_1$, the equalizing signal EQ is changed from the "H" level to the "L" level. The nMOS transistor 35 is thereby turned off to stop the operation of the sense amplifier, at the same time that the pMOS transistors 36, 37 and 38 are turned on. The result is the equalization and voltage pullup are performed. Therefore the voltage level at the same amplifier side input terminal of the NOR circuit 27 is raised. When the voltage level at the sense amplifier side input terminal of the NOR circuit 27 exceeds the threshold voltage Vth of the NOR circuit 27, the output level of the NOR circuit 27 is changed from the "H" level to the "L" level, so that the gate voltage $V_{GH}$ of the nMOS transistor $M_1$ is lowered.

At time $t_2$, the gate voltage $V_{GH}$ reaches an intermediate level suited to the driving capability of the nMOS transistor $M_4$ which has been in the turned-on state and the driving MOS transistor of the NOR circuit 27 operating to pull down to the low level side. At time $t_3$, a little later than time $t_2$, the nMOS transistor $M_3$ is turned on by means of the NOR circuit 26, so that the gate voltage $V_{GH}$ similarly reaches an intermediate level suited to the driving capability of each of the nMOS transistor $M_3$ and the driving MOS transistor of the NOR circuit 28 operating to pull down to the low level side.

Then, at time $t_4$, the equalizing signal EQ is again changed from the "L" level to the "H" level to activate the sense amplifier. When the signal D is changed to the "L" level, the sense amplifier output, that is the voltage level of the sense amplifier side input terminal of the NOR circuit 27, is at the "H" level, while the voltage level at the sense amplifier side input terminal of the NOR circuit 28, is at the "L" level. As a result of these changes in the input voltage levels, the output of the NOR circuit 27 is changed from the above mentioned intermediate level to a lower "L" level, whereas the output of the NOR circuit 28 is changed from the above mentioned intermediate level to the "H" level. In keeping with these changes in the output voltage levels, the gate voltage $V_{GL}$ of the nMOS transistor $M_2$ is quickly raised in level due to high speed electrical charging caused by the driving of the nMOS transistor $M_3$ which has already been turned on and of the NOR circuit 28. With the output of the NOR circuit 28 at the "H" level, the output of the NOR circuit 25 is at the "L" level, so that the nMOS transistor $M_4$ is turned off. Thus the gate voltage $V_{GH}$ of the nMOS transistor $M_1$ is at the "L" level, equal to the output level of the NOR circuit 27, without being affected by the nMOS transistor $M_4$. At this stage, the voltage level $D_{out}$ at the output terminal 22 starts to be lowered, as shown at (c) in FIG. 2, with the noise level being slightly increased, as shown at (d) in FIG. 2.

The gate voltage $V_{GL}$ of the nMOS transistor $M_2$ is then increased and, at time $t_5$, the gate to source voltage of the nMOS transistor $M_3$ falls below the threshold voltage Vth. This causes the nMOS transistor $M_3$ to be turned off, so that the gate of the nMOS transistor $M_2$ is changed solely by the NOR gate 28, and hence the rate of increase of the gate voltage $V_{GL}$ is lowered. Thus, after time $t_5$, the noise level is lowered to eliminate the inconvenience brought about by the switching noise.

Figure 3:
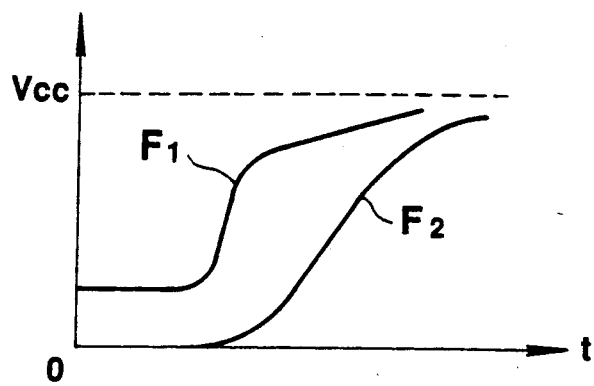
FIG. 3 is a waveform diagram in which changes in the MOS transistor gate voltages at the output stage of the conventional output circuit are compared to those at the output stage of the output circuit shown in FIG. 1.
Figure 4:
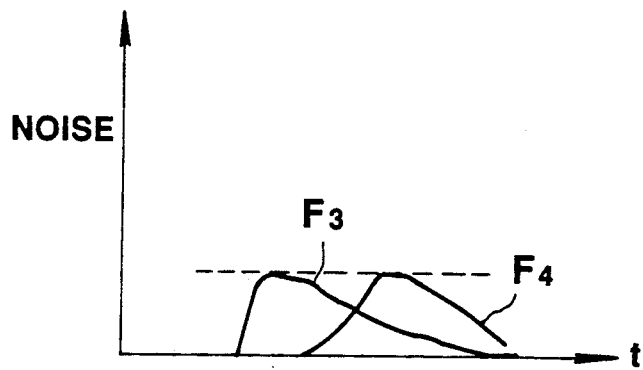
FIG. 4 is a waveform diagram in which changes in the GND noise in the output circuit of FIG. 1 are compared to those in the conventional output circuit.
Figure 5:
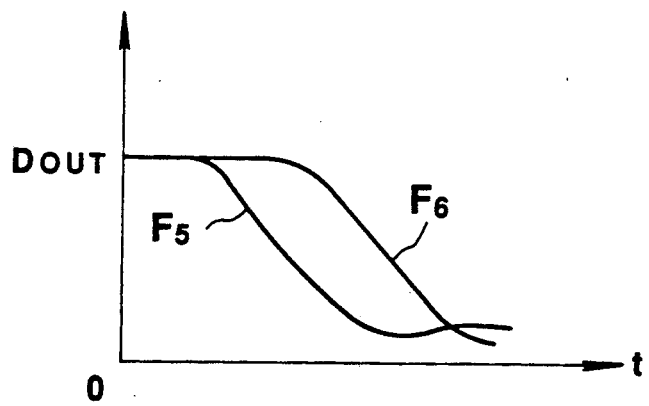
FIG. 5 is a waveform diagram in which changes in the voltage at the output terminal of the output circuit shown in FIG. 1 are compared to those at the output terminal of the conventional output circuit.

The favorable effects shown in FIGS. 3 to 5 become apparent from the comparison of the above described output circuit of the present embodiment and the conventional output circuit in which the gate of the output stage MOS transistor is not charged or discharged electrically.

FIG. 3 shows the results of a comparison of the gate voltage $V_{GL}$, wherein a curve $F_1$ depicts the characteristics of the output circuit of the present embodiment, and a curve $F_2$ depicts those of the conventional output circuit. It will be seen that, with the output circuit of the present embodiment, the voltage level transition proceeds at a higher speed because of the above described electrical charging at the higher rate by the nMOS transistor $M_3$ and, after the nMOS transistor $M_3$ is turned off, the voltage level rises gradually. However, the voltage level transition proceeds at a higher rate on the whole than with the conventional output circuit.

FIG. 4 shows the results of a comparison of the GND noise as the switching noise, wherein a curve $F_3$ depicts characteristics of the output circuit of the present embodiment, and a curve $F_4$ depicts that of the conventional output circuit. It will be seen from the comparison of the curves $F_3$ and $F_4$ that the present embodiment is capable of high speed outputting without the same noise level characteristics of the conventional circuit.

FIG. 5 shows the results of a comparison of the voltages at the output terminals, wherein a curve $F_5$ depicts characteristics of the output circuit of the present embodiment and a curve $F_6$ depicts those of the conventional output circuit. It is apparent from FIG. 5 that data outputting may occur at a higher speed with the output circuit of the present embodiment than with the conventional output circuit.

It will be seen from the foregoing that a high speed outputting becomes possible with the output circuit of the present embodiment because the nMOS transistors $M_3$ and $M_4$ operate simultaneously with the NOR circuits 27 and 28 at the time of outputting with the voltage level being changed. On the other hand, when the gate voltage falls below the threshold voltage Vth of the nMOS transistors $M_3$ and $M_4$, after the end of the high speed transition in the voltage level, these nMOS transistors $M_3$ and $M_4$ are turned off. Thus the switching noise may be reduced as compared with the case in which the nMOS transistors $M_3$ and $M_4$ are maintained at all times in the operating state. Since the MOS transistors $M_3$ and $M_4$ provided for realizing high speed level transistion are of the same conductivity type, stable operation may be assured even on occurrence of dispersions in manufacture.

Thus, with the output circuit of the present invention, the third and the fourth MOS transistors have their sources connected to the gates of the second and first output stage MOS transistors and, by the cooperation of these third and fourth MOS transistors and the control circuit, the gates of the second and first MOS transistors are charged or discharged electrically with changes in data. In other words, data outputting may occur at a higher rate because the third and the fourth MOS transistors contribute to electrical charging. In addition, by the turning on of the third and the fourth MOS transistors prior to the timing of the data output, as a result of saving the switching time, the present embodiment is capable of higher speed access time. It will be noted that the sources of these third and fourth MOS transistors are connected to the first and second MOS transistors which are changed in voltage level. Thus, when the gate to source voltages of the third and the fourth MOS transistors fall below the threshold voltage Vth of these third and fourth MOS transistors, these MOS transistors are turned off and hence no longer contribute to changes in the gate voltages of the second and first MOS transistors. Therefore, there is little increase of the switching noise by addition of the third and the fourth MOS transistors.

With the above described output circuit of the present invention, high speed output level transistion becomes possible since the third and the fourth transistors contribute to gate voltage transitions of the output stage MOS transistors. These third and fourth MOS transistors have their sources connected to the gates of the output stage MOS transistors, so that the level transition rate is retarded when the gate voltages of the output stage MOS transistors are raised to values lower than the threshold voltage of the third and the fourth MOS transistors, thereby reducing the switching noise.

What is claimed is:

1. An output circuit, comprising:
   an output stage including a first MOS transistor having its drain and source connected to a power voltage line and an output terminal and a second MOS transistor having its drain and source connected to said output terminal and to ground potential;
   a third MOS transistor having its source connected to the gate of said second MOS transistor and having its drain supplied with a predetermined voltage;
   a fourth MOS transistor having its source connected to the gate of said first MOS transistor and having its drain supplied with a predetermined voltage; and
   control circuit means receiving at its input data for output at said output terminal and having outputs connected for controlling said first, second, third, and fourth MOS transistors such that said first and second MOS transistors output said data and such that said third and fourth MOS transistors become turned on prior to timing of data being output at said output terminal.

2. An output circuit according to claim 1 wherein said control circuit means has an output enable signal input.

3. An output circuit according to claim 2 wherein said control circuit means has first, second, third, and fourth logic elements, each of which has an input connected to said output enable signal input such that said output enable signal controls all four logic elements.

4. An output circuit according to claim 1 wherein said control circuit means includes a first logic element whose output connects to the gate of said first MOS transistor, a second logic element whose output connects to a gate of the second MOS transistor, a third logic element whose output connects to a gate of said third MOS transistor, and a fourth logic element whose output connects to a gate of said fourth MOS transistor, and wherein said data input to said control circuit means comprises first and second data lines with the first data line connecting to said first logic element and the second data line connecting to said second logic element and wherein an output of said second logic element controls said fourth logic element and an output of said first logic element controls said third logic element.

5. An output circuit according to claim 1 wherein said control circuit means comprises first, second, third, and fourth logic elements whose outputs are connected for controlling said first, second, third, and fourth MOS transistors, and wherein an output enable signal is provided which is connected to control each of said first through fourth logic elements.

6. An output circuit according to claim 1 wherein channels of said first and third MOS transistors are of a same conductivity type and channels of said second and fourth MOS transistors are of a same conductivity type.

7. An output circuit according to claim 1 wherein said third and fourth MOS transistors are NMOS transistors having their drains supplied with a same source voltage.

8. An output circuit according to claim 1 wherein said control circuit means data input is connected to a sense amplifier output.

9. An output circuit according to claim 1 wherein a sense amplifier is provided having a data output connected to the data input of the control circuit means and wherein equalizing circuit means is also connected to the data input of said control circuit means.

10. An output circuit according to claim 1 wherein drains of said third and fourth MOS transistors are connected to a same predetermined voltage.

11. An output circuit, comprising:
an output stage including a first MOS transistor having its drain and source connected to a power voltage line and an output terminal and a second MOS transistor having its drain and source connected to said output terminal and to ground potential;
a third MOS transistor having its source connected to the gate of said second MOS transistor and having its drain supplied with a predetermined voltage;
a fourth MOS transistor having its source connected to the gate of said first MOS transistor and having its drain supplied with a predetermined voltage;
control circuit means receiving at its input data for output at said output terminal and having outputs connected for controlling said first, second, third, and fourth MOS transistors such that said first and second MOS transistors output said data and such that said third and fourth MOS transistors become turned on prior to timing of data being output at said output terminal; and
said third and fourth MOS transistors being of a same conductivity type and connecting at their drains to a predetermined voltage other than ground potential and with their sources connecting to respective gates of the third and fourth MOS transistors.

12. An output circuit, comprising:
an output stage including a first MOS transistor having its drain and source connected to a power voltage line and an output terminal and a second MOS transistor having its drain and source connected to said output terminal and to ground potential;
a third MOS transistor having its source connected to the gate of said second MOS transistor and having its drain supplied with a predetermined voltage;
a fourth MOS transistor having its source connected to the gate of said first MOS transistor and having its drain supplied with a predetermined voltage;
control circuit means receiving at its input data for output at said output terminal and having outputs connected for controlling said first, second, third, and fourth MOS transistors such that said first and second MOS transistors output said data and such that said third and fourth MOS transistors become turned on prior to timing of data being output at said output terminal; and
said control circuit means comprising first, second, third, and fourth, logic elements connected to gates of said first, second, third, and fourth MOS transistors, and an input at which an output enable signal is connected to control the first through fourth logic elements.

13. An output circuit, comprising:
an output stage including a first MOS transistor having its drain and source connected to a power voltage line and an output terminal and a second MOS transistor having its drain and source connected to said output terminal and to ground potential;
a third MOS transistor having its source connected to the gate of said second MOS transistor and having its drain supplied with a predetermined voltage;
a fourth MOS transistor having its source connected to the gate of said first MOS transistor and having its drain supplied with a predetermined voltage; and
control circuit means receiving at its input data for output at said output terminal and having four separate outputs connected for controlling said first, second, third, and fourth MOS transistors, the four separate outputs respectively connecting to the four respective gates of the first through fourth transistors, and wherein signals at the output terminal are not fed back to affect the control circuit means.

14. An output circuit, comprising:
an output stage including a first MOS transistor having its drain and source connected to a power voltage line and an output terminal and a second MOS transistor having its drain and source connected to said output terminal and to ground potential;
a third MOS transistor having its source connected to the gate of said second MOS transistor and having its drain supplied with a predetermined voltage;
a fourth MOS transistor having its source connected to the gate of said first MOS transistor and having its drain supplied with a predetermined voltage; and
control circuit means receiving at its input data for output at said output terminal and having outputs connected for controlling said first, second, third, and fourth MOS transistors such that said first and second MOS transistors output said data and such that said third and fourth MOS transistors are turned on as a voltage level of an input signal to the first and second MOS transistors begins changing during an initial high speed transition, and then are turned off as the voltage level rises gradually thereafter so that initially the third and fourth transistors enable high switching speed but thereafter by being turned off during a remaining portion of voltage level transition, a switching noise is reduced since the third and fourth transistors are no longer directly driving the first and second transistors.

* * * * *